(12) United States Patent
Lamanna et al.

(10) Patent No.: US 8,638,141 B1
(45) Date of Patent: Jan. 28, 2014

(54) PHASE-LOCKED LOOP

(75) Inventors: Pasquale Lamanna, Cannes (FR);
Nicolas Sornin, La Tronche (FR);
Davide Orifiamma, Valbonne (FR);
Cristian Pavao Moreira, Frouzins (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/599,496

(22) Filed: Aug. 30, 2012

(30) Foreign Application Priority Data

Jul. 31, 2012 (GB) .................................. 1213601.6

(51) Int. Cl.
*H03L 7/06* (2006.01)
(52) U.S. Cl.
USPC ......................................................... 327/156
(58) Field of Classification Search
USPC .................................. 327/156–161
See application file for complete search history.

(56) References Cited

U.S. PATENT DOCUMENTS

| | | | |
|---|---|---|---|
| 7,532,038 B2 * | 5/2009 | Lin | 327/12 |
| 2011/0133799 A1 * | 6/2011 | Dunworth et al. | 327/157 |

\* cited by examiner

*Primary Examiner* — Daniel Rojas
(74) *Attorney, Agent, or Firm* — Lando & Anastasi, LLP

(57) ABSTRACT

A phase-locked loop for generating an output signal including a signal generator arranged to generate an output, a comparison unit arranged to compare the output with a reference signal so as to provide a digital signal, and a loop filter arranged to generate a control signal for controlling the signal generator in dependence on the digital signal. The loop filter includes a proportional path having a digital filter arranged to generate a first component of the control signal for controlling the phase of the output generated by the signal generator, and an analogue integral path arranged to generate a second component of the control signal for controlling the frequency of the output generated by the signal generator.

16 Claims, 2 Drawing Sheets

PHASE-LOCKED LOOP

BACKGROUND OF THE INVENTION

This invention relates to a phase-locked loop.

A phase-locked loop is a circuit that generates an output signal having a predetermined frequency and/or phase relationship with a reference signal. A typical phase-locked loop is shown in FIG. 1. The phase-locked loop comprises an oscillator 101 for generating a signal of fixed frequency and a phase/frequency detector (PFD) 102 for comparing the fixed frequency signal (the reference signal) with a feedback signal generated by a feedback loop 106. The PFD is connected to a charge pump 103. The PFD outputs a signal to the charge pump that is representative of the phase and/or frequency difference between the feedback signal and the reference signal. The charge pump injects a current into a loop filter 104 in dependence on the signal it receives from the PFD. Typically, this current injection will take the form of either an 'up' or 'down' current generated by current sources 108 and 109 respectively, so that current flows either into or out of the loop filter. In other words, the PFD and charge pump act together to output either positive or negative charge "pulses" in dependence on whether the reference signal phase leads or lags the feedback signal. The loop filter filters these charge pulses to generate a control signal for a signal generator 105.

The signal generator is typically a voltage-controlled oscillator (VCO) controlled by tuning the voltage at its control inputs. The loop filter is typically arranged to integrate the current pulses it receives from the charge pump to generate the tuning voltage necessary for controlling the VCO. If the feedback signal lags the reference signal, it is necessary to speed up the VCO. Conversely, if the feedback signal leads the reference signal, it is necessary to slow down the VCO. The frequency of the signal output by the phase-locked loop can be changed by varying the frequency of the reference signal. Often, the reference signal is generated by a very stable oscillator whose frequency cannot be varied. Therefore, it can be beneficial to include a divider in the feedback loop so that the output frequency of the phase-locked loop can be varied without having to change the frequency of the reference signal. In FIG. 1, this feedback divider is shown at 107. If the divide ratio is a constant N, then the loop forces the output signal to be exactly N times the reference signal frequency. The divide ratio N can be changed in integer steps to change the frequency of the signal generator.

SUMMARY OF THE INVENTION

One limitation with the type of phase-locked loop described above is that the output frequency cannot be varied in steps any smaller than the reference frequency ($F_{REF}$). This is because N can only have integer values, so that the smallest change in the output frequency that can be made is $1 \times F_{REF}$. Therefore, for fine frequency resolution, it is preferred to have a small reference frequency. However, due to mismatches in the phase-locked loop's charge pump and other factors such as the non-ideal behaviour of the PFDs, the charge pump tends to output small charge pulses that cause sidebands to appear in the output signal of the VCO, even when the phase-locked loop is locked.

Another problem with this type of phase-locked loop is the effect of pulling on the VCO. Components that are connected to the phase-locked loop, such as a power amplifier, can cause the undesired effect of pulling of the frequency of the VCO off the desired output frequency. This can lead to distortions and degradation of the output from the phase-locked loop.

This VCO pulling effect may be mitigated using many different methods. In one commonly used method, VCO pulling can be mitigated using a fractional VCO and an output mixer. However, this leads to the presence of unwanted spurs due to the mixer. Removal of these spurs requires several LC band pass filters, which leads to an increase in the required circuit area and power consumption. In applications such as direct conversion transmitters (where the VCO frequency can equal or be a multiple of the output frequency), the effects of pulling can be very high and thus requires even greater circuit area and increased power consumption.

Another technique for mitigating VCO pulling is to use an offset VCO in a double loop phase-locked loop. However, this technique requires complicated circuitry and larger power consumption. Furthermore, interference between the loops can lead the PLL to lock to a frequency incorrectly.

There is therefore a need for an improved phase-locked loop that does not suffer from VCO pulling.

According to a first aspect of the disclosure there is provided a phase-locked loop for generating an output signal comprising: a signal generator arranged to generate an output; a comparison unit arranged to compare the output with a reference signal so as to provide a digital signal; a loop filter arranged to generate a control signal for controlling the signal generator in dependence on the digital signal, the loop filter comprising: a proportional path comprising a digital filter arranged to generate a first component of the control signal for controlling the phase of the output generated by the signal generator; and an analogue integral path arranged to generate a second component of the control signal for controlling the frequency of the output generated by the signal generator.

Suitably, the digital filter comprises a finite impulse response filter.

Suitably, the integral path comprises a charge pump and an integrator.

Suitably, the integrator comprises a capacitor.

Suitably, the comparison unit comprises a binary phase detector.

Suitably, the comparison unit is arranged to sample the output at a rate, the frequency of the output being dependent on said rate. Suitably, said rate being dependent on a rate control signal.

Suitably, the frequency of the reference signal is greater than 1 GHz.

Suitably, the signal generator comprises a ring oscillator.

Suitably, the output signal being the output from the signal generator.

Suitably, the phase-locked loop further comprises a divider arranged to receive and frequency divide the output from the signal generator, the output signal being the said divided output.

According to a second aspect of the disclosure there is provided a circuit comprising: a phase-locked loop as described above; and an amplifier having a modulation bandwidth, wherein the bandwidth of the phase-locked loop is greater than the modulation bandwidth of the amplifier.

According to a third aspect of the disclosure there is provided a method for generating an output signal comprising: generating an output at a signal generator; comparing the output with a reference signal so as to provide a digital signal; at a loop filter, generating a control signal for controlling the signal generator in dependence on the digital signal, the loop filter comprising: a proportional path comprising a digital filter to generate a first component of the control signal for controlling the phase of the output generated by the signal generator; and an analogue integral path to generate a second component of the control signal for controlling the frequency of the output generated by the signal generator.

BRIEF DESCRIPTION OF THE DRAWINGS

For a better understanding of the present invention, reference is made by way of example to the following drawings, in which.

DETAILED DESCRIPTION

A phase-locked loop (PLL) can be configured to have a high bandwidth. By utilising a high bandwidth, the PLL can remove noise in the VCO and consequently also mitigate possible pulling effects from an amplifier (which, for example, in some applications, may be a high power RF amplifier that can provide up to or greater than 1 Watt (30 dBm) of RF power) or any other device in communication with the PLL that can pull the VCO with a defined large bandwidth modulated signal. If the bandwidth of the PLL is larger than the modulation bandwidth of the amplifier, then the effects of pulling from the amplifier can be removed by the large bandwidth of the PLL loop. However, a PLL with high bandwidth suffers from the problem of increased noise in the components before the VCO (i.e. the PFD, charge pump, loop filter and feedback divider). In some applications, this noise can occur at PLL bandwidths greater than 40 MHz.

Thus to solve the problem of VCO pulling, a high bandwidth PLL with a hybrid structure is implemented.

Figure 2:
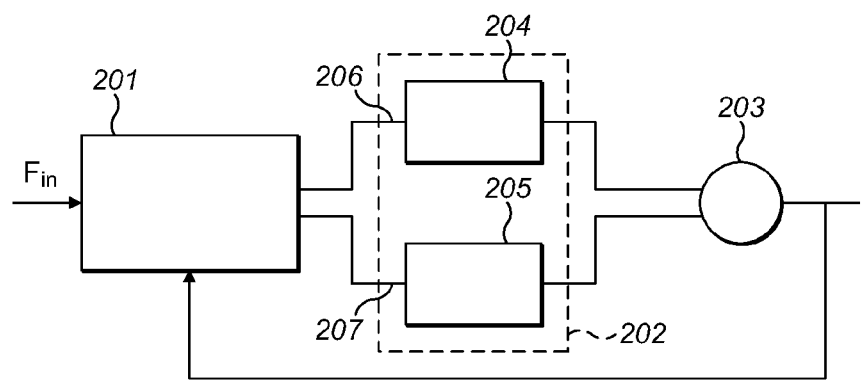
FIG. 2 shows a phase-locked loop with a hybrid loop filter.

FIG. 2 shows a high bandwidth PLL with a hybrid loop filter. The PLL comprises a comparison unit 201, a hybrid loop filter 202 and a signal generator 203. The comparison unit 201 is arranged to receive at least two signals, compare the signals and output a result of that comparison. The comparison unit 201 is arranged to receive a reference signal $F_{in}$ and compare its phase and/or frequency with that of the signal output by the signal generator 203 (i.e. the feedback signal).

The comparison unit 201 may be a binary phase detector (BPD), which can also be known as a bang-bang phase detector. The BPD can be arranged to output a high or low level output signal depending on the sign of the input phase difference. Such a simple phase detector allows the use of very high reference signal frequency (for example, up to 1.2 GHz or 2 GHz or higher). The BPD may be a coarse digital-to-phase 1-bit converter, which can provide an estimation of input phase error between the reference signal and the feedback signal. The signal output from the comparison unit may be a digital signal which indicates the difference in the phase between the reference signal and the signal output by the signal generator. The BPD may be a D flip flop.

The digital signal output by the comparison unit 201 can be provided to the hybrid loop filter 202. The hybrid loop filter 202 may be arranged to control the signal generator 203 by outputting a control signal for controlling the signal generator 203 in dependence on the digital signal. The control signal formed by the hybrid loop filter 202 may have two components: a proportional component for controlling the phase of the output generated by the signal generator and an integral component for controlling the frequency of the output generated by the signal generator.

Figure 3:
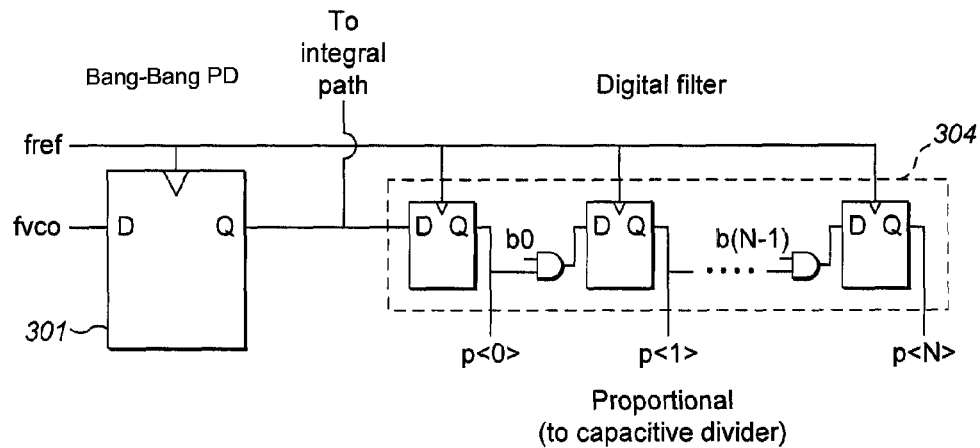
FIG. 3 shows a part of a proportional path of a hybrid loop filter.
Figure 4:
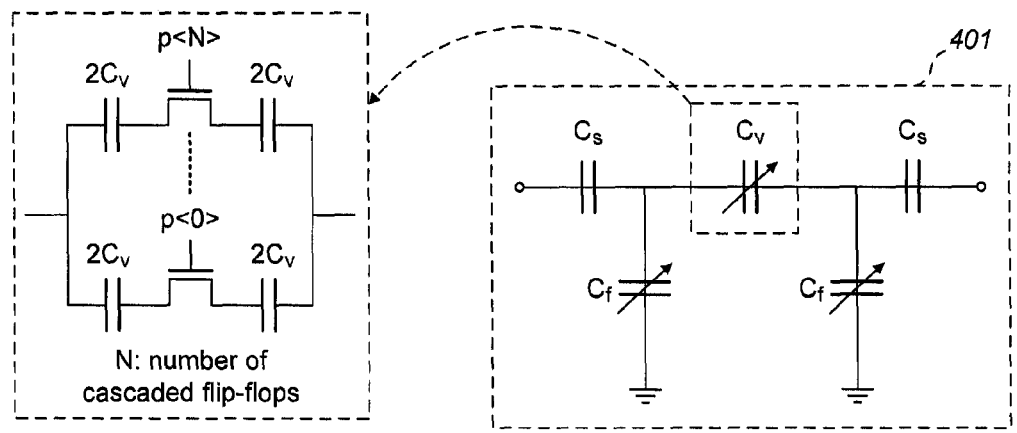
FIG. 4 shows another part of the proportional path.

The hybrid loop filter 202 may comprise a path for generating each of the two components of the control signal. The proportional path may comprise a digital filter 204 so as to control the phase of the signal output by the signal generator in a digital way. The digital filter 204 may be or may comprise a finite impulse response (FIR) filter. FIG. 3 illustrates an example of the proportional path. The output of the bang-bang phase detector 301 can be provided to the FIR filter 304. The FIR filter 304 can comprise a series of N registers. The output (P<N>) of the N registers can be provided to switch a series of N switches in the capacitive divider 401 shown in FIG. 4. The capacitive divider may form part of the input of a VCO. The capacitive divider can allow capacitance changes in the range of attoFarads to be realised at the VCO. This change in the capacitance can change frequency of the VCO ($F=1/(2\pi\sqrt{(LC)})$) for a fixed period of time to produce a variation in the phase of the signal output by the VCO. By this, the proportional path can control the phase of the signal output by the VCO.

The integral path may be analogue and controls the frequency of the signal output by the signal generator. The integral path may comprise a charge pump and an integrator 205. The charge pump can provide a current that drives the charge of a variable capacitor that controls the frequency output by the VCO. The integrator may be a capacitor for integrating the input signal. The proportional and integral paths may be decoupled in the hybrid loop filter 202 such that each path has a transfer function relating the received signal to its respective component of the control signal that is independent of the other path.

By providing a hybrid loop filter 202 with an analogue integral path and a digital proportional path, the stability and performance of the high bandwidth PLL is enhanced. The digital proportional path negates the noise issue associated with high bandwidth PLLs (for example, bandwidths greater than 40 MHz). As this path is digital and not analogue, there is no electrical noise present. Thus, due to the hybrid loop filter 202, the PLL does not introduce any additional noise (i.e. in addition to the reference signal $F_{in}$ noise) within its operating band.

FIG. 2 shows a PLL comprising a hybrid loop filter 202 that comprises decoupled integral and proportional paths. The proportional path is shown at 206 and the integral path is shown at 207. Each of the paths is arranged to generate a respective component of the control signal for the signal generator 203 in dependence on an input digital signal that is indicative of a phase-difference between the reference signal $F_{in}$ and the signal output by the signal generator 203.

The decoupling of the integral and proportional paths means that the hybrid loop filter 202 is more flexible than pre-existing PLLs because both paths can be independently optimised to perform its respective function without affecting the other path. Therefore, fewer or no compromises are required when choosing component values.

The signal generator 203 may be a VCO or a digitally controlled oscillator (DCO) or any other suitable oscillator. The signal generator 203 may be or may comprise a ring oscillator VCO. Compared to other oscillators, particularly the LC resonator based oscillators, the ring oscillator is compact and it can provide higher frequencies with lower power consumption. Furthermore, a ring oscillator VCO can provide quadrature outputs, which is useful in certain applications. Due to the reduction in noise generated by PLL of the present invention, the phase noise requirements for the ring oscillator VCO can be relaxed, thus allowing greater flexibility in choosing component values when designing a wireless transceiver.

Figure 1:
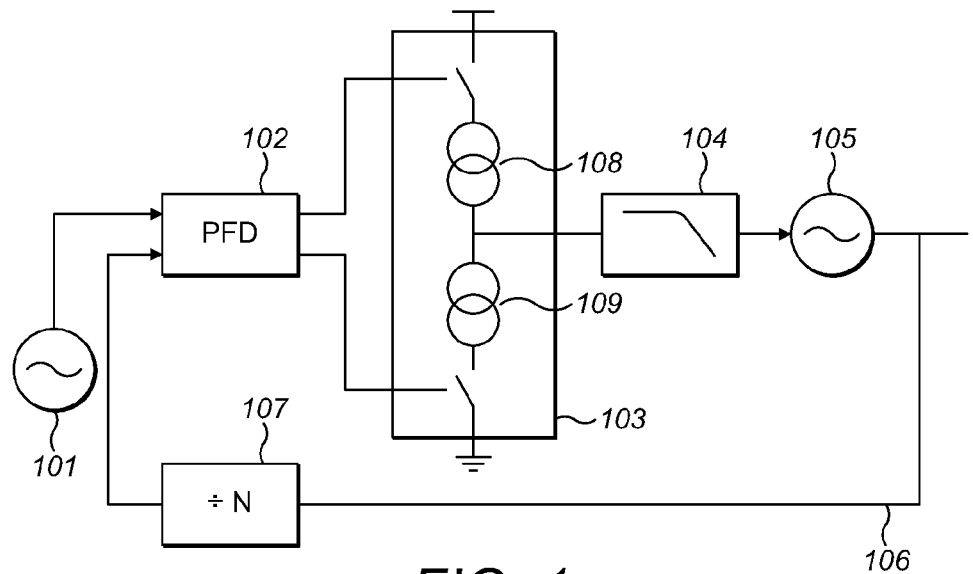
FIG. 1 shows a typical phase-locked loop.

Compared with a traditional PLL of FIG. 1, the presently claimed PLL may not require a feedback divider in the feedback path. The comparison unit 201 can be arranged to sample the signal output by the signal generator 203 at a particular rate so as to set the frequency of the signal output by the signal generator 203. In other words, the frequency of the signal generated by the signal generator 203 can be dependent on the rate at which the comparison unit 201 samples the signal generated by the signal generator 203. In one implementation, a BPD can have a sub-sampling integer capability. The sub-sampling rate of the BPD can be set by a rate control signal provided to the BPD. Thus the frequency of the signal output by the signal generator can be dependent on the rate control signal provided to the BPD. By not requiring the use of a feedback divider, as used in pre-existing PLLs, an additional source of noise has been removed by the presently claimed PLL. Furthermore, this also leads to a reduction in the required circuit area and power consumption.

The minimum frequency of the reference signal $F_{in}$ may be set from the Gardner stability criterion. The bandwidth of the PLL may therefore be less than 10 times the frequency of $F_{in}$. For example, $F_{in}$ may be greater than 1 GHz. The level of phase noise and spurs for the reference frequency $F_{in}$ may be determined by the application of the PLL (for example, determined by the transmitter/receiver requirements of a wireless protocol standard). The reference signal may be provided by an oscillator, for example a MEMS oscillator or the output of another PLL.

By utilising a BPD, the issue of dead zone noise in PFDs of pre-existing PLLs is removed. This avoids the generation of integer spurs and thus the filtering of such spurs does not need to be considered when choosing the bandwidth of the PLL. Therefore, the bandwidth can be increased to the maximum limit imposed by the Gardner stability criterion. Thus the PLL described herein allows for a greater bandwidth and is more flexible as it imposes fewer limitations than pre-existing PLLs.

The output from the signal generator may be divided by frequency dividers. These dividers may be implemented depending on the output frequency required from the PLL due to its application.

The PLL may be utilised in a circuit (e.g. a transmitter or receiver circuit) that comprises a source that causes the VCO pulling effects. For example, such a source may be a power amplifier (PA) that has a connection with the output of the signal generator 203. Said source may be any other device that can either push or pull the VCO. To reduce the effects of pulling by the PA, the bandwidth of the PLL may be greater than the modulation bandwidth of the PA. As mentioned above, by utilising the PLL described herein, noise associated with a high bandwidth implementation is removed and therefore the PLL described herein solves the problem of VCO pulling.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

What is claimed is:

1. A phase-locked loop for generating an output signal comprising:
   a signal generator arranged to generate the output signal;
   a comparison unit arranged to compare the output signal with a reference signal so as to provide a digital signal;
   a loop filter arranged to generate a control signal for controlling the signal generator in dependence on the digital signal, the loop filter comprising:
      a proportional path comprising a digital filter arranged to generate a first component of the control signal for controlling the phase of the output signal generated by the signal generator; and
      an analogue integral path arranged to generate a second component of the control signal for controlling the frequency of the output signal generated by the signal generator.

2. A phase-locked loop as claimed in claim 1, wherein the digital filter comprises a finite impulse response filter.

3. A phase-locked loop as claimed in claim 2, wherein the integral path comprises a charge pump and an integrator.

4. A phase-locked loop as claimed in claim 3, wherein the integrator comprises a capacitor.

5. A phase-locked loop as claimed in claim 1, wherein the integral path comprises a charge pump and an integrator.

6. A phase-locked loop as claimed in claim 5, wherein the integrator comprises a capacitor.

7. A phase-locked loop as claimed in claim 1, wherein the comparison unit comprises a binary phase detector.

8. A phase-locked loop as claimed in claim 7, wherein the comparison unit is arranged to sample the output signal at a rate, the frequency of the output being dependent on said rate.

9. A phase-locked loop as claimed in claim 8, said rate being dependent on a rate control signal.

10. A phase-locked loop as claimed in claim 1, wherein the comparison unit is arranged to sample the output signal at a rate, the frequency of the output being dependent on said rate.

11. A phase-locked loop as claimed in claim 10, said rate being dependent on a rate control signal.

12. A phase-locked loop as claimed in claim 1, wherein the frequency of the reference signal is greater than 1 GHz.

13. A phase-locked loop as claimed in claim 1, wherein the signal generator comprises a ring oscillator.

14. A phase-locked loop as claimed in claim 1, wherein the signal generator includes a divider arranged to receive and frequency divide the output signal from the signal generator, the output signal being the said divided output.

15. A circuit comprising:
   a phase-locked loop according to claim 1; and
   an amplifier having a modulation bandwidth, wherein the bandwidth of the phase-locked loop is greater than the modulation bandwidth of the amplifier.

16. A method for generating an output signal comprising:
   generating the output signal at a signal generator;
   comparing the output signal with a reference signal so as to provide a digital signal;
   at a loop filter, generating a control signal for controlling the signal generator in dependence on the digital signal, the loop filter comprising:
      a proportional path comprising a digital filter to generate a first component of the control signal for controlling the phase of the output signal generated by the signal generator; and
      an analogue integral path to generate a second component of the control signal for controlling the frequency of the output signal generated by the signal generator.

* * * * *